(12) United States Patent
Fujii et al.

(10) Patent No.: US 8,981,456 B2
(45) Date of Patent: Mar. 17, 2015

(54) SEMICONDUCTOR STORAGE DEVICE AND MANUFACTURING METHOD THEREOF

(71) Applicant: Kabushiki Kaisha Toshiba, Minato-Ku (JP)

(72) Inventors: Kenichi Fujii, Yokkaichi (JP); Tooru Hara, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/017,487

(22) Filed: Sep. 4, 2013

(65) Prior Publication Data

US 2014/0070303 A1    Mar. 13, 2014

(30) Foreign Application Priority Data

Sep. 7, 2012  (JP) .................................. 2012-197478

(51) Int. Cl.
| | |
|---|---|
| H01L 29/788 | (2006.01) |
| H01L 21/336 | (2006.01) |
| H01L 29/792 | (2006.01) |
| H01L 29/66 | (2006.01) |
| H01L 27/115 | (2006.01) |

(52) U.S. Cl.
CPC ........ *H01L 29/792* (2013.01); *H01L 29/66833* (2013.01); *H01L 27/11519* (2013.01); *H01L 27/11524* (2013.01)
USPC .......................................... 257/316; 438/316

(58) Field of Classification Search
CPC .................. H01L 27/11519; H01L 27/11524; H01L 27/115; H01L 29/66833; H01L 29/792; H01L 29/66825

USPC .......... 257/324, 326, 314, 330, 316; 438/287, 438/258, 257
See application file for complete search history.

(56) References Cited

U.S. PATENT DOCUMENTS

| | | |
|---|---|---|
| 5,641,991 A | 6/1997 | Sakoh |
| 6,353,242 B1 | 3/2002 | Watanabe et al. |
| 6,512,253 B2 | 1/2003 | Watanabe et al. |
| 6,882,592 B2 * | 4/2005 | Noguchi et al. ......... 365/230.03 |
| 6,974,979 B2 | 12/2005 | Watanabe et al. |

(Continued)

FOREIGN PATENT DOCUMENTS

| | | |
|---|---|---|
| JP | 08-078519 A | 3/1996 |
| JP | 11-284155 A | 10/1999 |

(Continued)

OTHER PUBLICATIONS

Sze, "Semiconductor Devices. Physics and Technology", 2002, John Willey & Sons, pp. 37-39.*

*Primary Examiner* — Nikolay Yushin
(74) *Attorney, Agent, or Firm* — Oblon, McClelland, Maier & Neustadt, L.L.P.

(57) ABSTRACT

A semiconductor storage device according to the present embodiment includes a semiconductor substrate. Each of memory cell arrays includes a plurality of memory cells on the semiconductor substrate. Select gate transistors are provided on ends of the memory cell arrays and brought into conduction when the memory cells are connected to a corresponding line. An embedded impurity layer is embedded in active areas between the select gate transistors respectively corresponding to the memory cell arrays adjacent to each other. Contact plugs connect the embedded impurity layer and the lines.

14 Claims, 18 Drawing Sheets

(56) References Cited

U.S. PATENT DOCUMENTS

| | | |
|---|---|---|
| 7,326,993 B2 | 2/2008 | Kajimoto et al. |
| 7,332,762 B2 | 2/2008 | Watanabe et al. |
| 7,425,739 B2 | 9/2008 | Watanabe et al. |
| 7,622,762 B2 | 11/2009 | Kajimoto et al. |
| 7,893,477 B2 | 2/2011 | Watanabe et al. |
| 8,084,802 B2 | 12/2011 | Watanabe et al. |
| 8,253,182 B2 | 8/2012 | Kajimoto et al. |
| 8,350,309 B2 | 1/2013 | Watanabe et al. |
| 2002/0047138 A1 | 4/2002 | Watanabe et al. |
| 2003/0107055 A1 | 6/2003 | Watanabe et al. |
| 2005/0024974 A1* | 2/2005 | Noguchi et al. ......... 365/230.03 |
| 2005/0051831 A1 | 3/2005 | Kajimoto et al. |
| 2005/0270846 A1 | 12/2005 | Watanabe et al. |
| 2007/0103983 A1 | 5/2007 | Watanabe et al. |
| 2008/0019190 A1 | 1/2008 | Watanabe et al. |
| 2008/0122098 A1 | 5/2008 | Kajimoto et al. |
| 2008/0303115 A1 | 12/2008 | Miyazaki et al. |
| 2010/0052032 A1 | 3/2010 | Kajimoto et al. |
| 2011/0134700 A1 | 6/2011 | Watanabe et al. |
| 2012/0075903 A1 | 3/2012 | Watanabe et al. |

FOREIGN PATENT DOCUMENTS

| | | |
|---|---|---|
| JP | 2002-110822 A | 4/2002 |
| JP | 2005-038884 A | 2/2005 |
| JP | 2008-305901 A | 12/2008 |

* cited by examiner

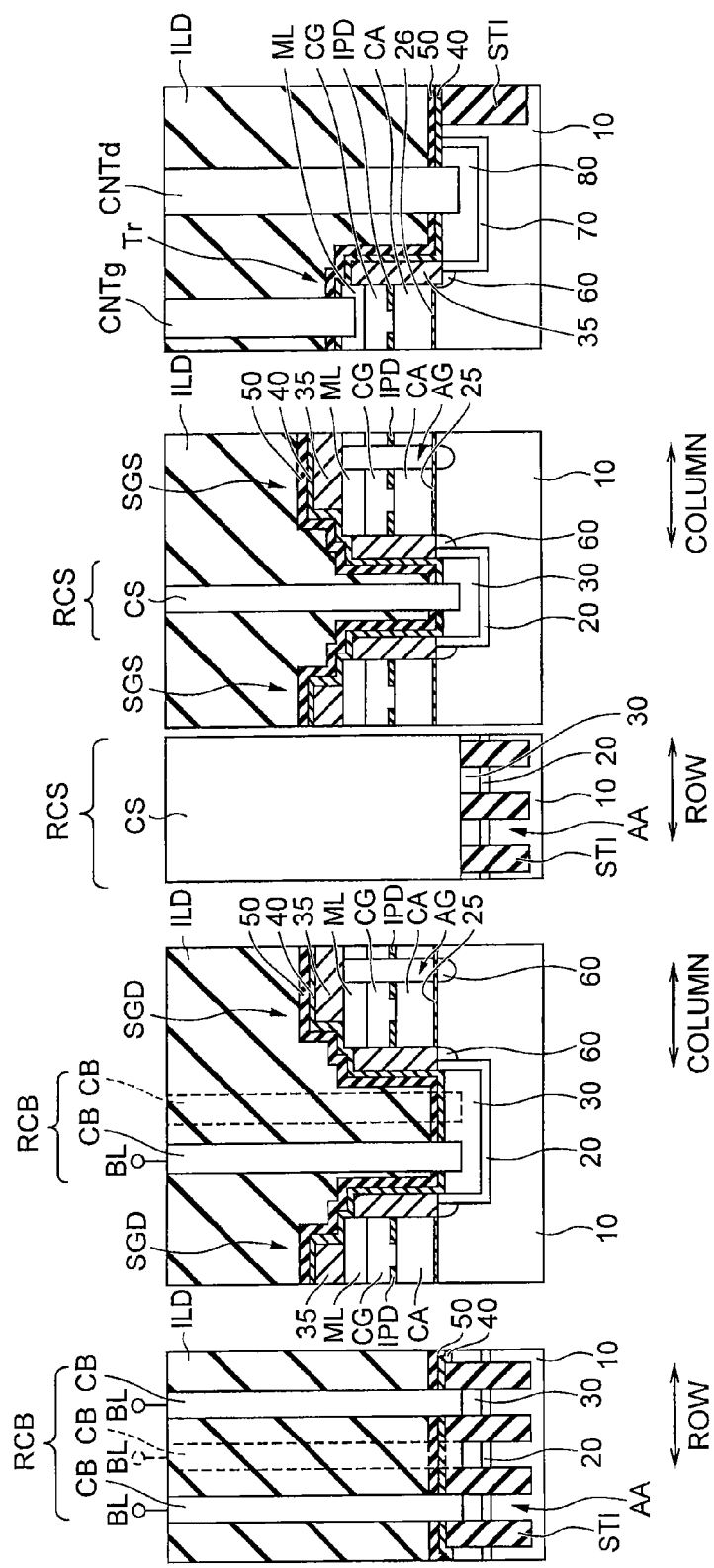

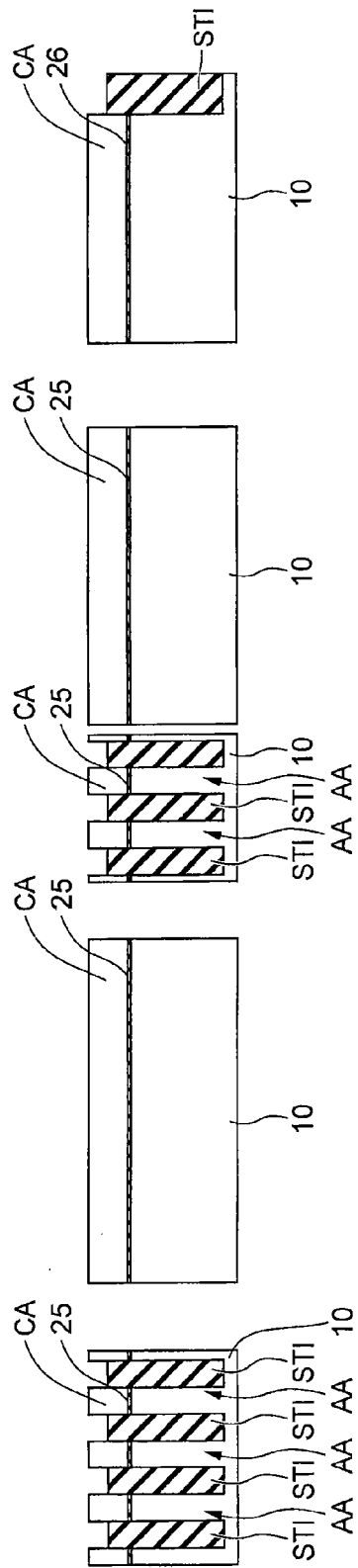

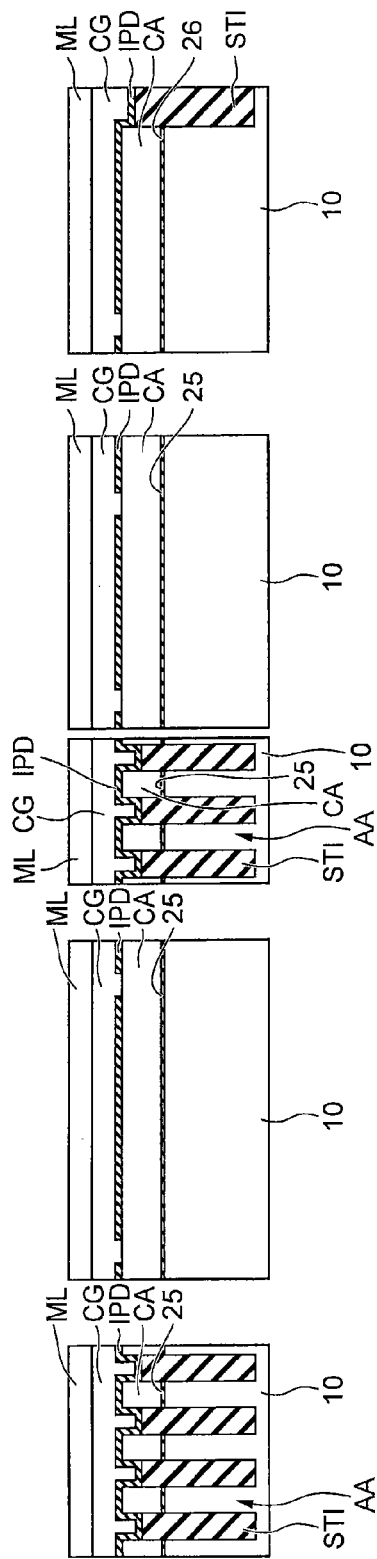

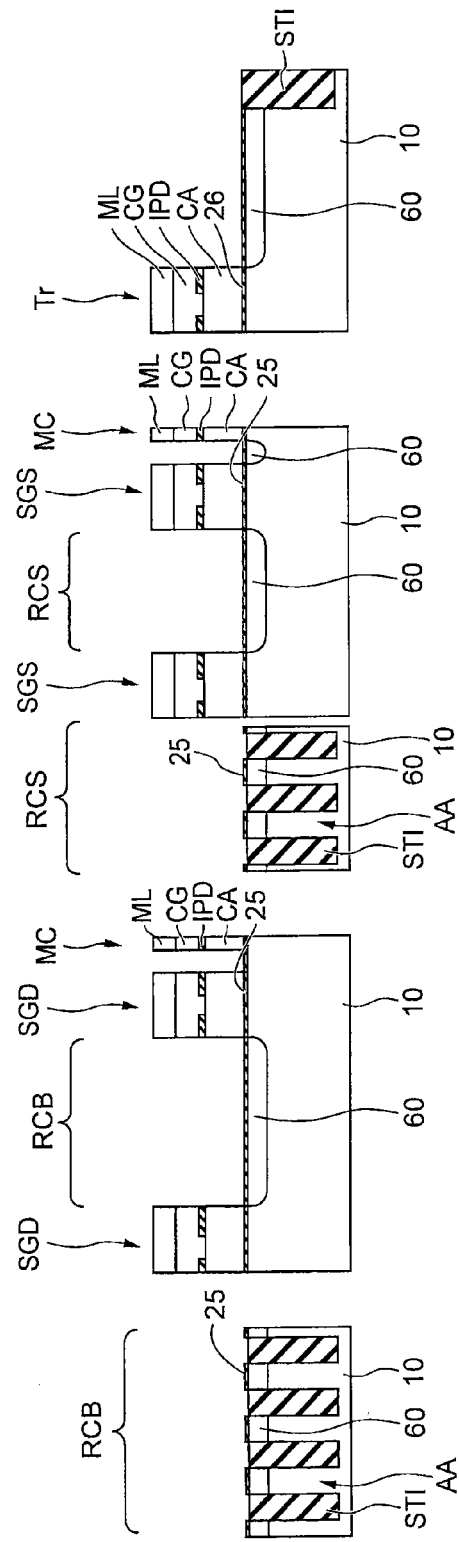

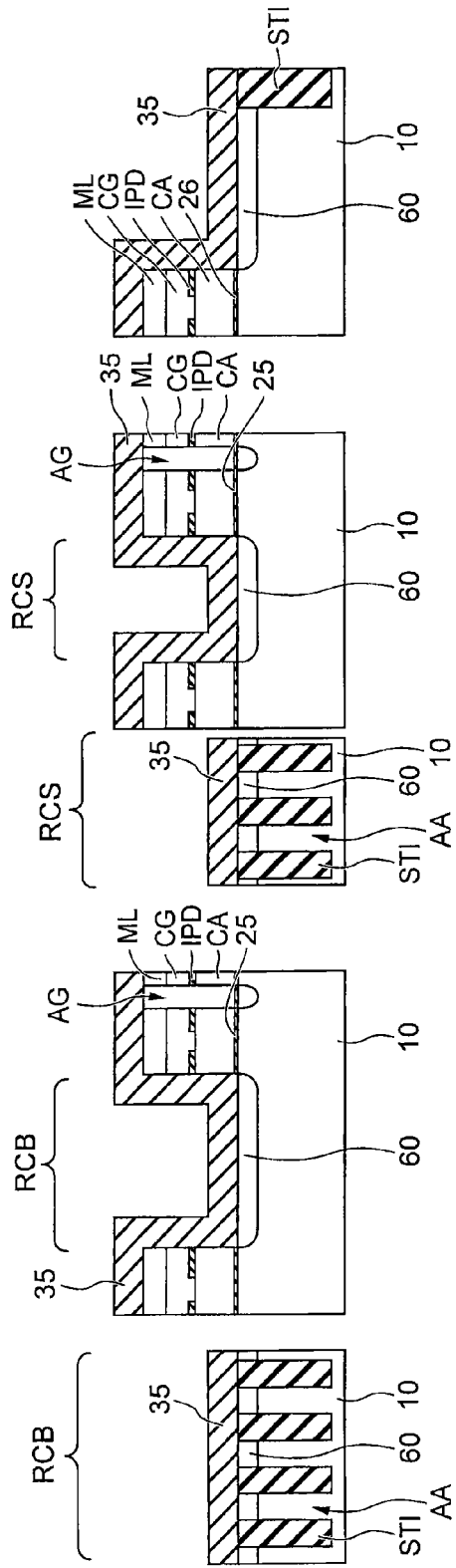

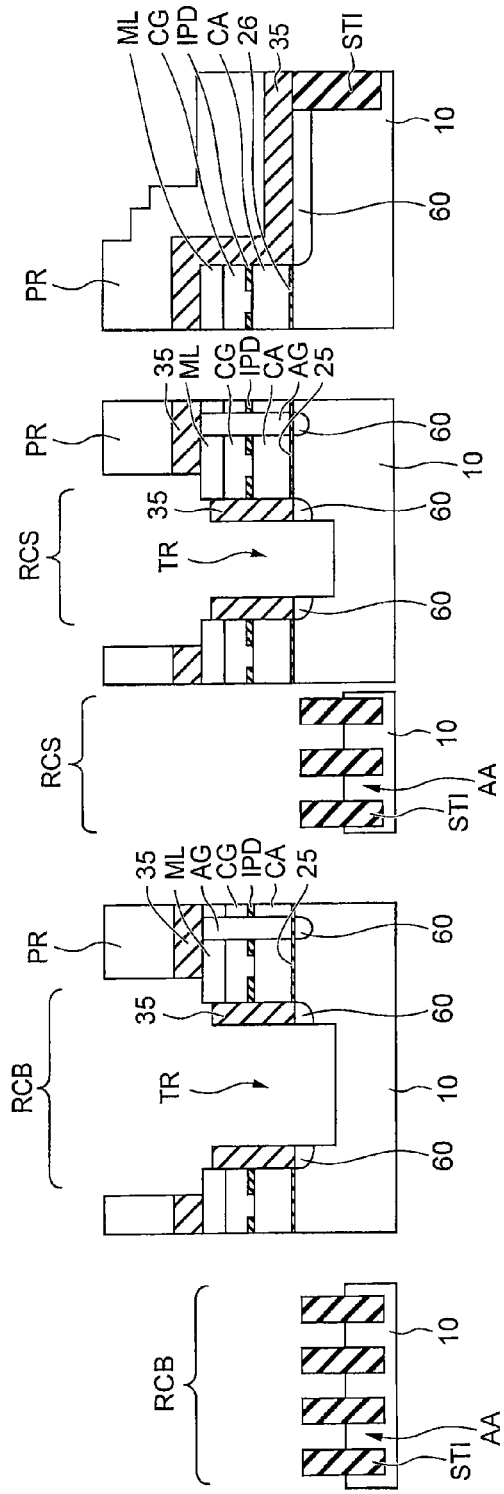

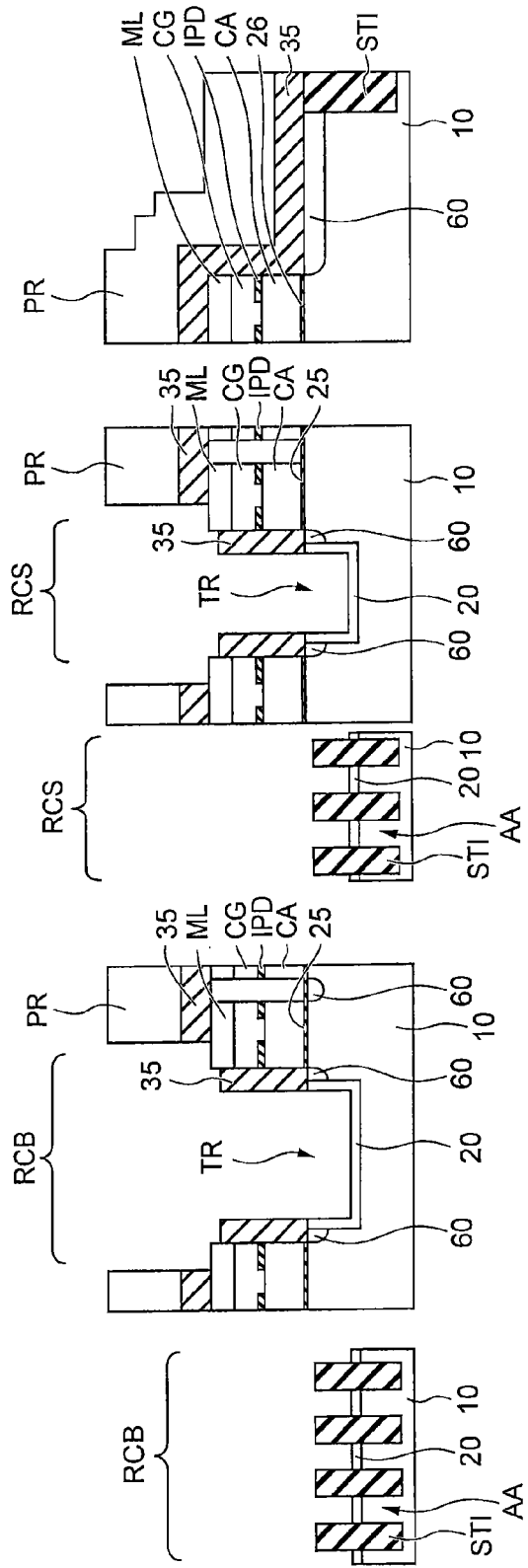

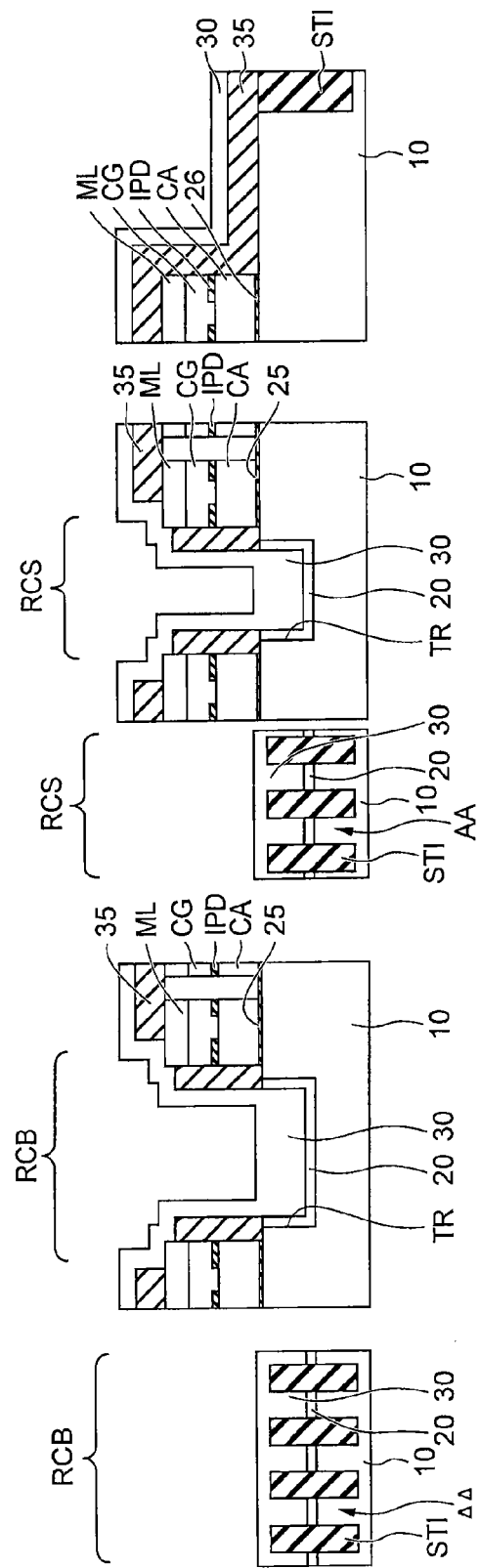

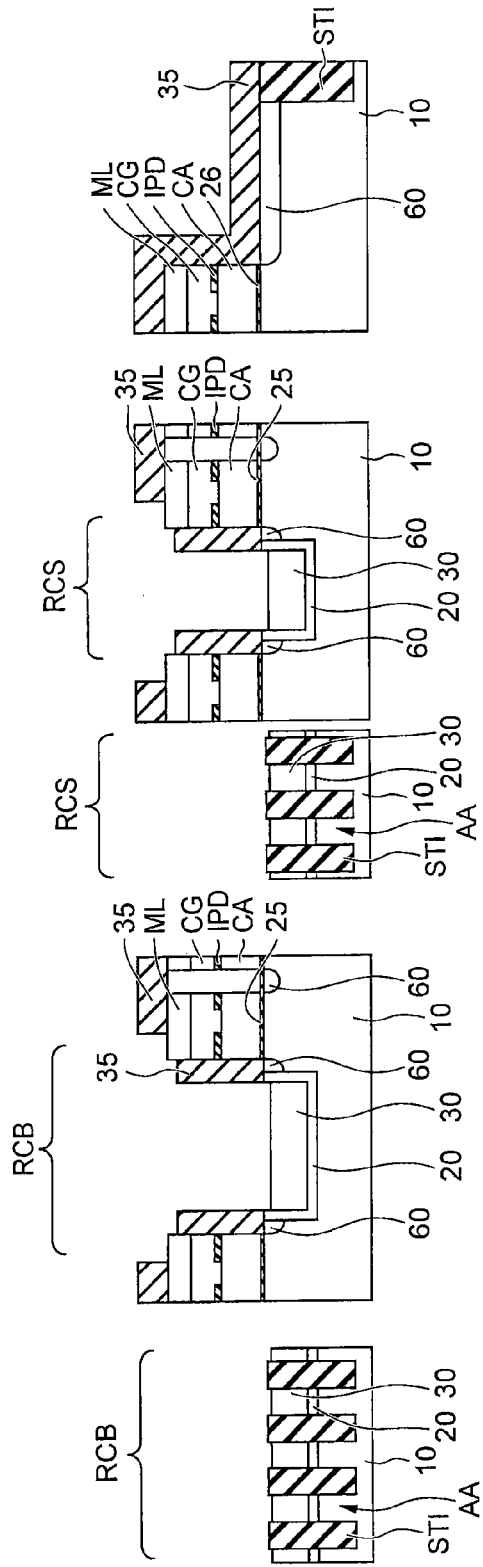

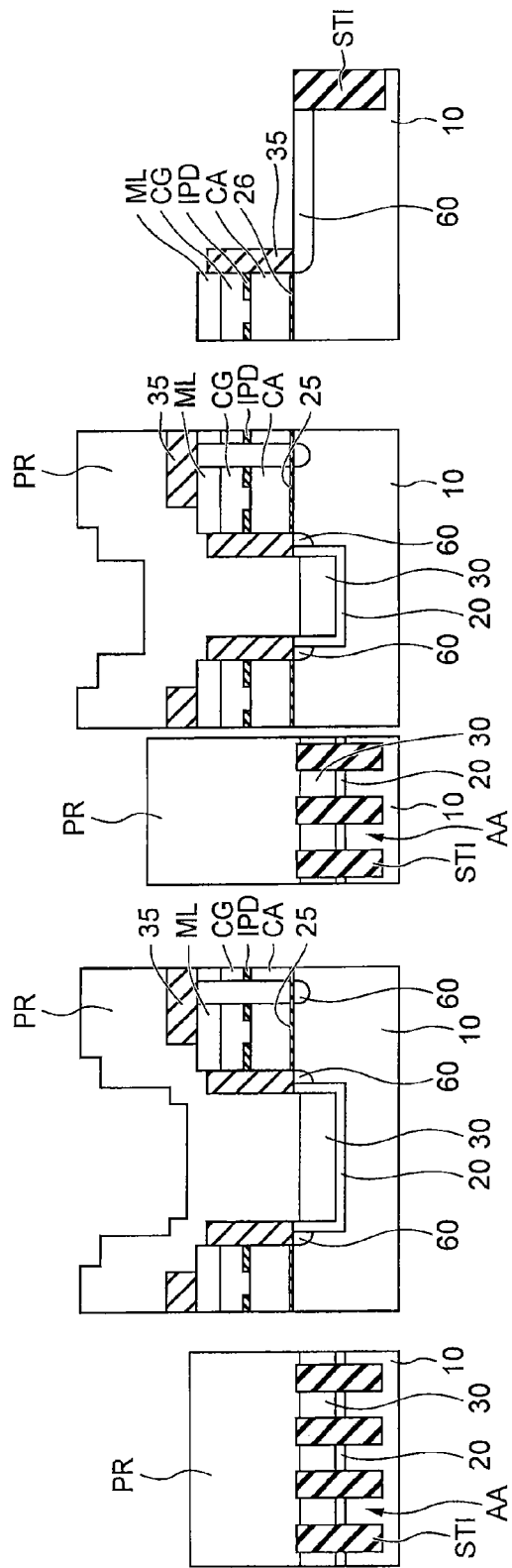

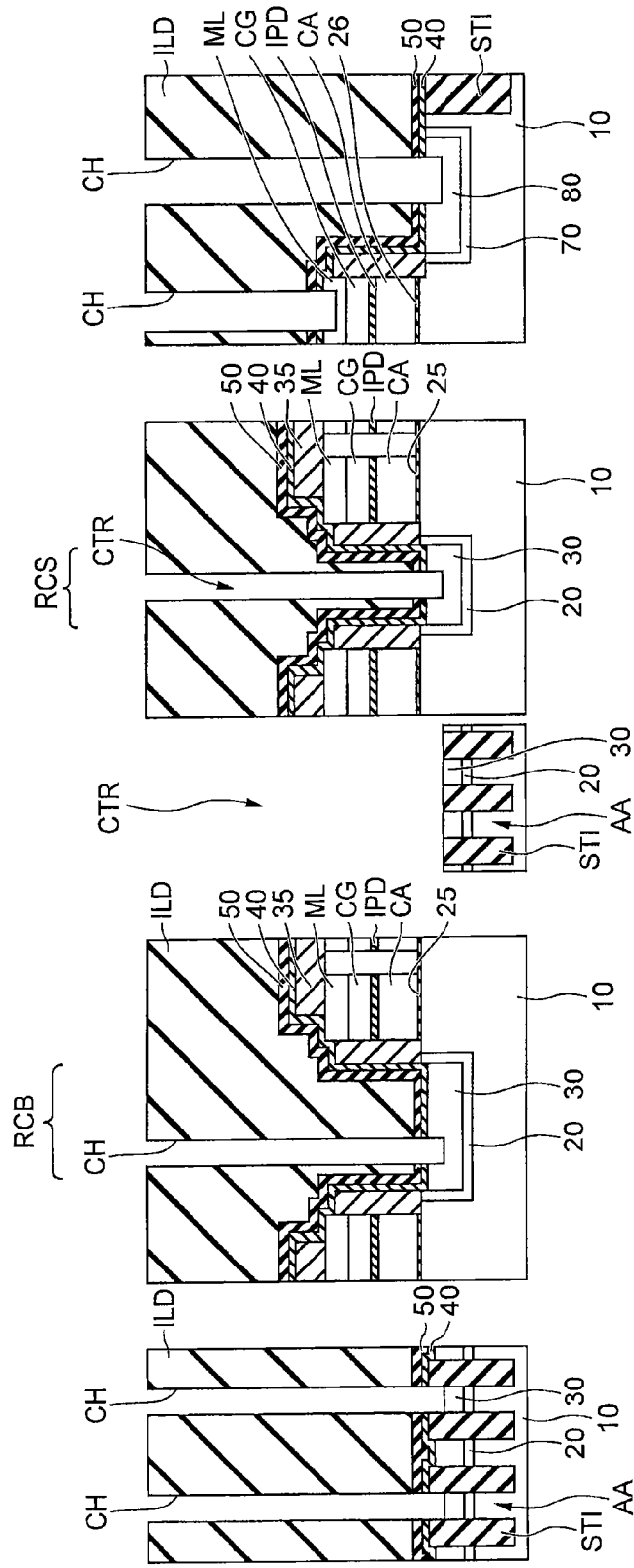

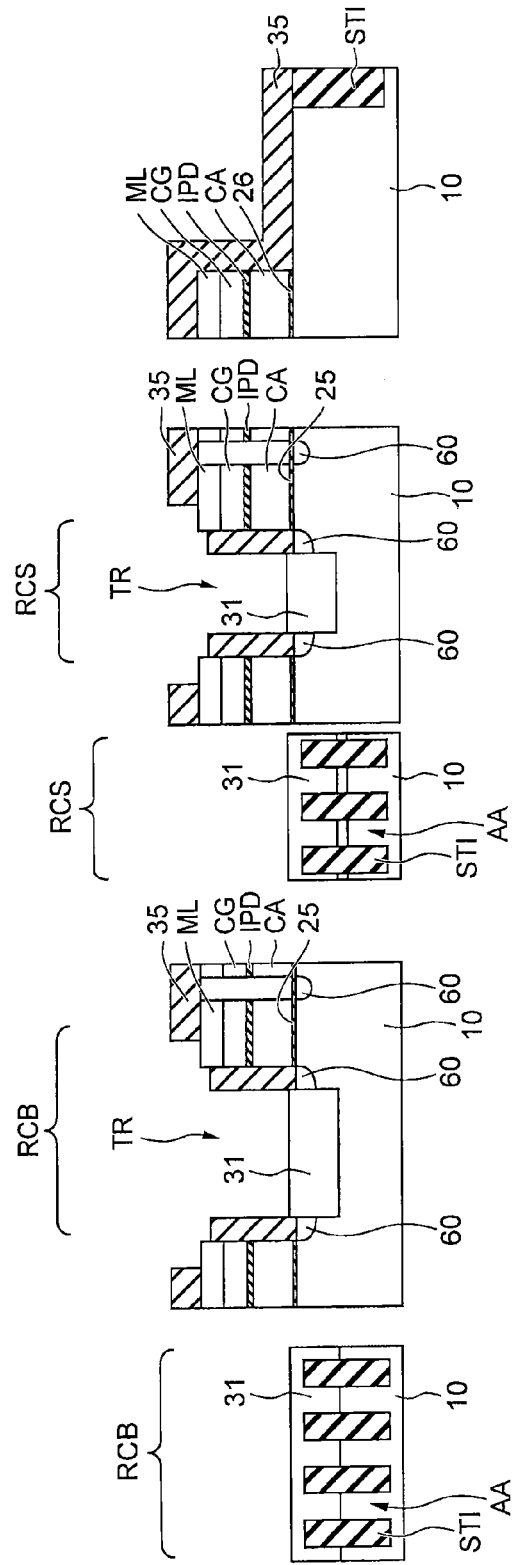

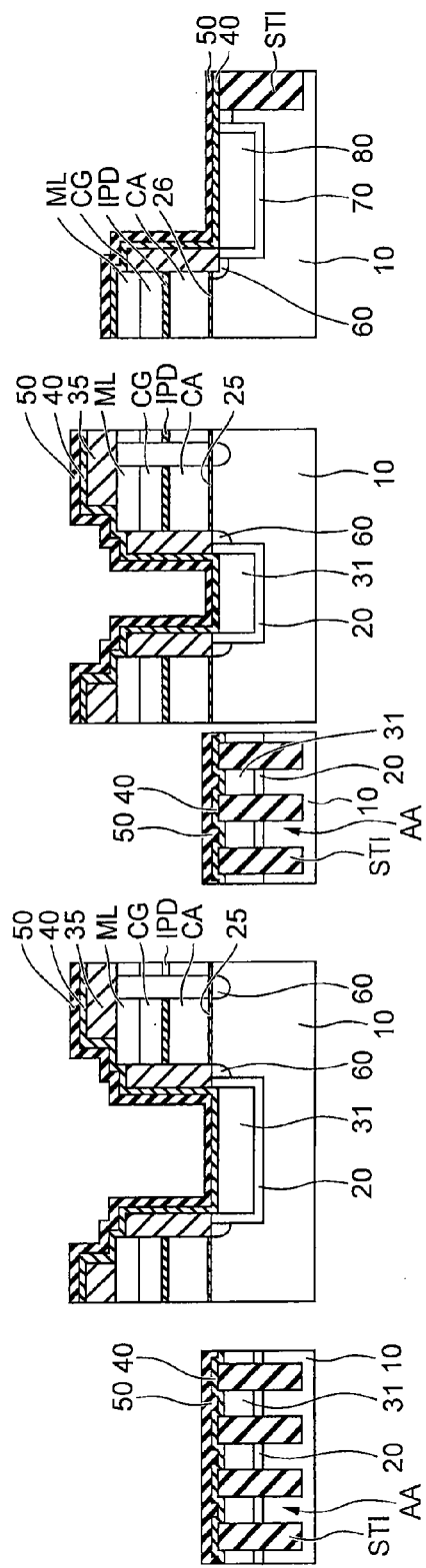

SEMICONDUCTOR STORAGE DEVICE AND MANUFACTURING METHOD THEREOF

CROSS REFERENCE TO RELATED APPLICATIONS

This application is based upon and claims the benefit of priority from the prior Japanese Patent Application No. 2012-197478, filed on Sep. 7, 2012, the entire contents of which are incorporated herein by reference.

FIELD

The embodiments of the present invention relate to a semiconductor device and manufacturing method thereof.

BACKGROUND

In semiconductor storage devices such as a NAND flash EEPROM (Electrically Erasable Programmable Read-Only Memory), regions between adjacent memory cell arrays are conventionally used as bit-line contact regions. In each of the bit-line contact regions, a bit line in an upper layer is electrically connected to an active area via a contact plug. In these bit-line contact regions, a diffusion layer is formed for the contact plug to connect to the corresponding active area. The diffusion layer is formed in a high concentration similarly to a diffusion layer used for memory cells or transistors of peripheral circuits. Therefore, to form the diffusion layer, a high dose amount of impurities is ion-implanted into the active areas at a high acceleration energy.

However, when the distance (the bit-line contact region) between two select gate transistors adjacent to each other between the memory cell arrays is narrowed or when the distance between active areas is reduced, crystal defects in the active areas or deformations thereof due to impurity ion implantation become non-negligible. The crystal defect in the active area causes an increase in the contact resistance. Furthermore, the deformation of the active area causes a short circuit of the contact plug to an erroneous active area (another bit line).

BRIEF DESCRIPTION OF THE DRAWINGS

FIGS. 4A to 4E are one example of a cross-sectional view along the line A-A in FIG. 2, a cross-sectional view along the line B-B in FIG. 2, a cross-sectional view along the line C-C in FIG. 3, a cross-sectional view along the line D-D in FIG. 3, and a cross-sectional view of a transistor part of a peripheral circuit, respectively;

FIGS. 5A to 15E are one example of cross-sectional views showing a method of manufacturing the NAND flash EEPROM according to the first embodiment; and FIGS. 16A to 18E are one example of cross-sectional views showing a method of manufacturing the NAND flash EEPROM according to the second embodiment.

DETAILED DESCRIPTION

Embodiments will now be explained with reference to the accompanying drawings. The present invention is not limited to the embodiments. In the embodiments, "an upper direction" or "a lower direction" refers to a relative direction when a direction of a surface of a semiconductor substrate on which semiconductor elements are provided is assumed as "an upper direction". Therefore, the term "upper direction" or "lower direction" occasionally differs from an upper direction or a lower direction based on a gravitational acceleration direction.

A semiconductor storage device according to the present embodiment includes a semiconductor substrate. Each of memory cell arrays includes a plurality of memory cells on the semiconductor substrate. Select gate transistors are provided on ends of the memory cell arrays and brought into conduction when the memory cells are connected to a corresponding line. An embedded impurity layer is embedded in active areas between the select gate transistors respectively corresponding to the memory cell arrays adjacent to each other. Contact plugs connect the embedded impurity layer and the lines.

(First Embodiment)

Figure 1:
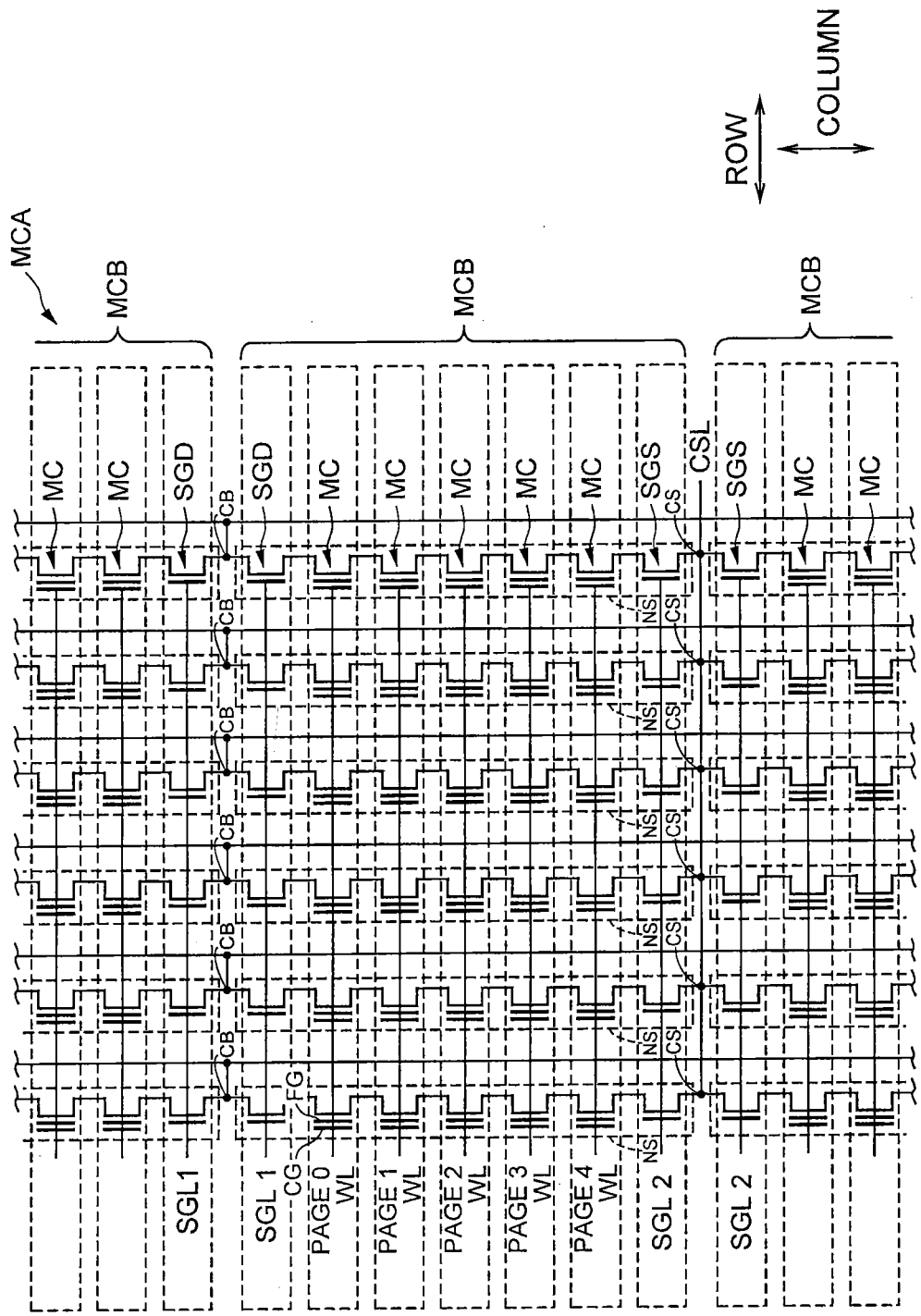
FIG. 1 is one example of a configuration diagram of a memory cell array MCA of a NAND flash EEPROM according to a first embodiment.

FIG. 1 is one example of a configuration diagram of a memory cell array MCA of a NAND flash EEPROM according to a first embodiment. The memory cell array MCA includes a plurality of NAND strings NS connected to bit lines BL of respective columns. Each of the NAND strings NS includes a plurality of series-connected memory cells MC and select gate transistors SGS and SGD connected to opposite ends of these memory cells MC. While five memory cells MC are series-connected in each of the NAND strings NS in this example, 32 or 64 memory cells MC are generally series-connected. An end of each NAND string NS is connected to the corresponding bit line BL via a bit contact CB and the other end thereof is connected to a common source line SL via a source contact CS.

FIG. 1 shows memory cell blocks MCB each being a data erase unit as the memory cell array MCA. The memory cell array MCA generally includes a plurality of the memory cell blocks MCB as shown in FIG. 1. Adjacent ones of the memory cell blocks MCB share a source contact CS or a bit contact CB. Therefore, adjacent ones of the memory cell blocks MCB are arranged symmetrically with respect to a cell source line CSL or the corresponding source contact CS. Alternatively, adjacent ones of the memory cell blocks MCB are arranged symmetrically with respect to the corresponding bit contact CB.

A control gate CG of each of the memory cells MC is connected to a word line WL of a page to which the memory cell MC belongs. Gates of the select gate transistors SGD and SGS are connected to select gate lines SGL1 and SGL2, respectively. A page is a unit of data read or data write.

A plurality of word lines WL extend in a row direction and a plurality of bit lines BL extend in a column direction to be substantially perpendicular to the row direction.

As shown in FIG. 1, each of the memory cells MC is provided corresponding to each of intersections of the word lines WL and the bit lines BL. While the memory cell array MCA (the memory cell block) according to the first embodiment includes 5×6 (30) memory cells MC, the number of memory cells MC in one memory cell block MCB is not limited thereto.

An n-FET (Field-Effect Transistor) having a charge accumulation layer CA and a control gate CG can be used as the memory cell MC. By applying a voltage to the control gate CG through the corresponding word line WL, charges (electrons) are injected to the charge accumulation layer CA or emitted from the charge accumulation layer CA. In this way, data is written in the corresponding memory cell MC or data in the memory cell MC is erased. Each of the memory cells MC has a threshold voltage corresponding to the number of charges (electrons) accumulated in the charge accumulation layer CA. The memory cell MC can electrically store therein binary data (one bit) or multivalued data (two or more bits) as a difference in the threshold voltage. The memory cell MC thus can be a charge-accumulation nonvolatile memory.

Figure 2:
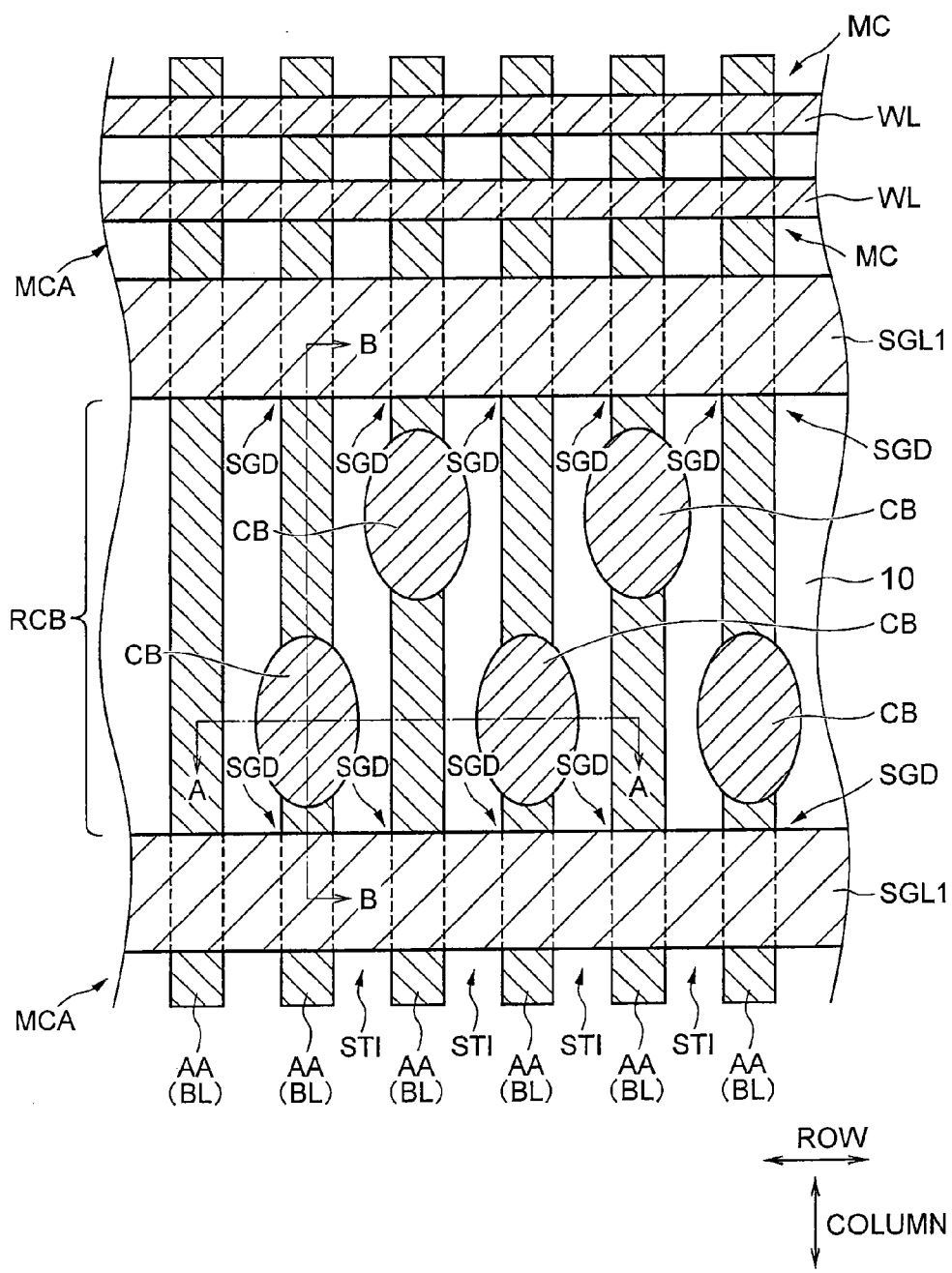
FIG. 2 is one example of a planar layout diagram of the bit contacts CB and peripheral regions thereto.

FIG. 2 is one example of a planar layout diagram of the bit contacts CB and peripheral regions thereto. Active areas AA and shallow trench isolations STI are provided in stripes on a surface of a semiconductor substrate 10. The shallow trench isolations STI extend in the column direction on opposite sides of each of the active areas AA and define the active areas AA.

The active areas AA extend in the column direction similarly to the bit lines BL and correspond to the bit lines BL, respectively. Therefore, the memory cells MC are formed at intersections of the active areas AA and the word lines WL, respectively. The word lines WL extend in the row direction to be connected to gate electrodes of the memory cells MC or function as gate electrodes of the memory cells MC, respectively.

Each of the select gate transistors SGD is provided at each of intersections of the active areas AA and the select gate lines SGL1. As explained with reference to FIG. 1, each of the select gate transistors SGD is provided on an end of each memory cell array MCA and is provided to connect the memory cells MC (the NAND string NS) in the corresponding memory cell array MCA to the bit contact CB. The select gate transistor SGD is brought into conduction when the memory cells MC in the corresponding memory cell array MCA are connected to a line such as the bit line BL.

A region between the select gate transistors SGD respectively corresponding to two memory cell arrays MCA adjacent to each other is used as a bit contact region RCB. The bit contacts CB each connecting the corresponding active area AA and the corresponding bit line BL are provided in the bit contact regions RCB.

To shrink a memory, widths in the row direction of the active areas AA and the shallow trench isolations STI are formed narrow. On the other hand, the bit contacts CB are limited by a processing margin for lithography and exposure misalignment with the active areas AA and the connection resistance between the active areas AA and the bit contacts CB, and thus are formed to have a width wider than that of the active areas AA. Therefore, if the bit contacts CB are arranged to align with each other linearly in the row direction, the bit contacts CB adjacent in the row direction are short-circuited. To suppress short circuits of the bit contacts CB, two bit contacts CB in the active areas AA adjacent to each other are displaced in the column direction. That is, the bit contacts CB are arranged in a zigzag manner or a staggered manner.

Figure 3:
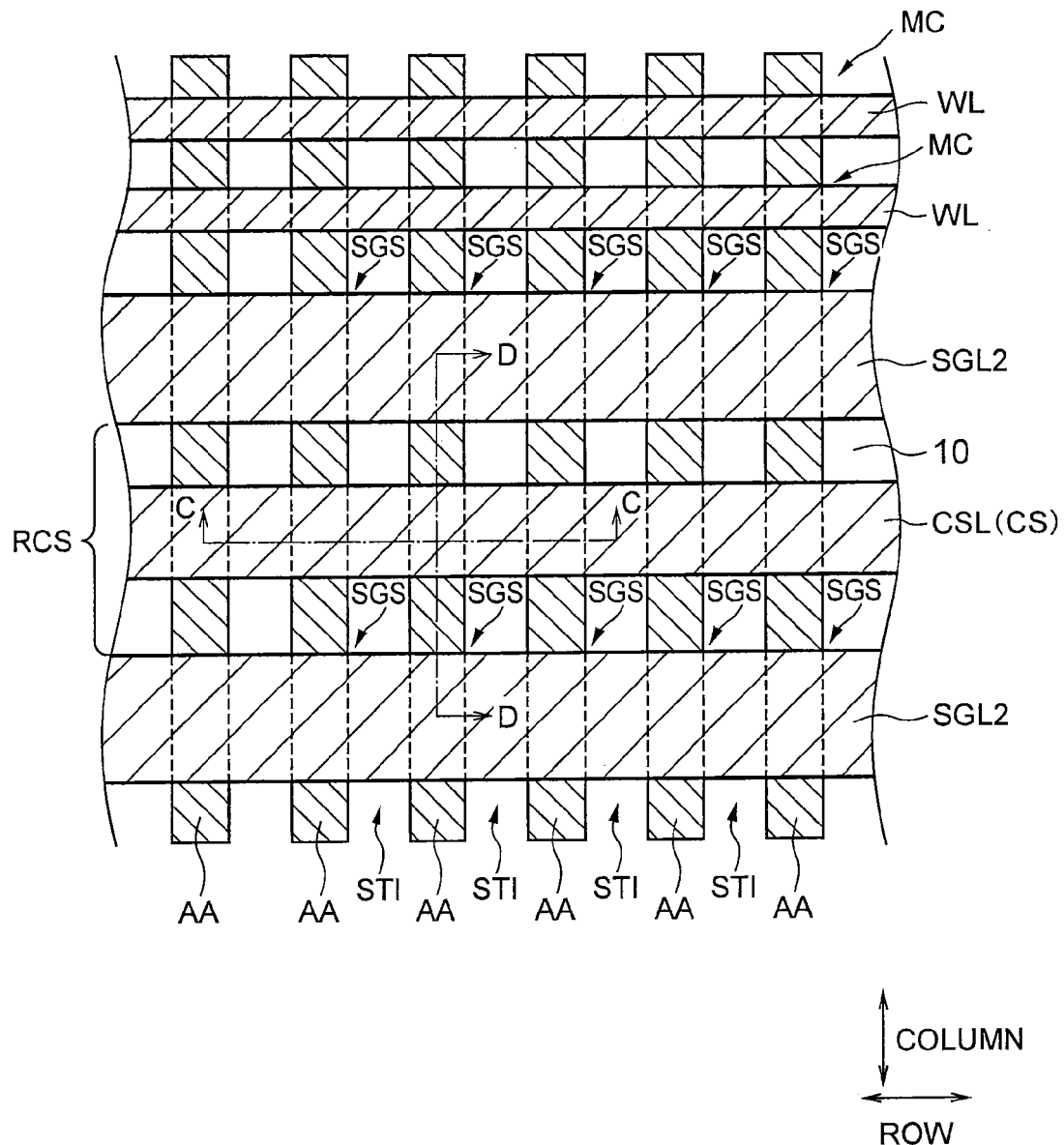
FIG. 3 is one example of a planar layout diagram of the source contacts CS and peripheral regions thereto.
Figures 14A, 14B, 14C, 14D, 14E:
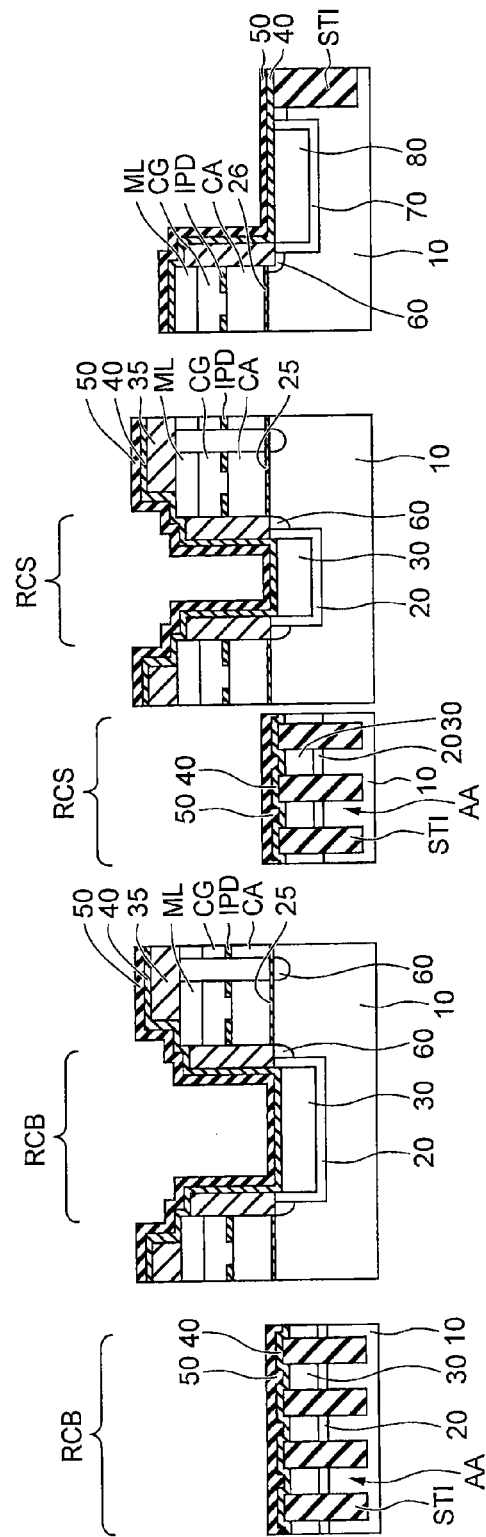
Figures 17A, 17B, 17C, 17D, 17E:
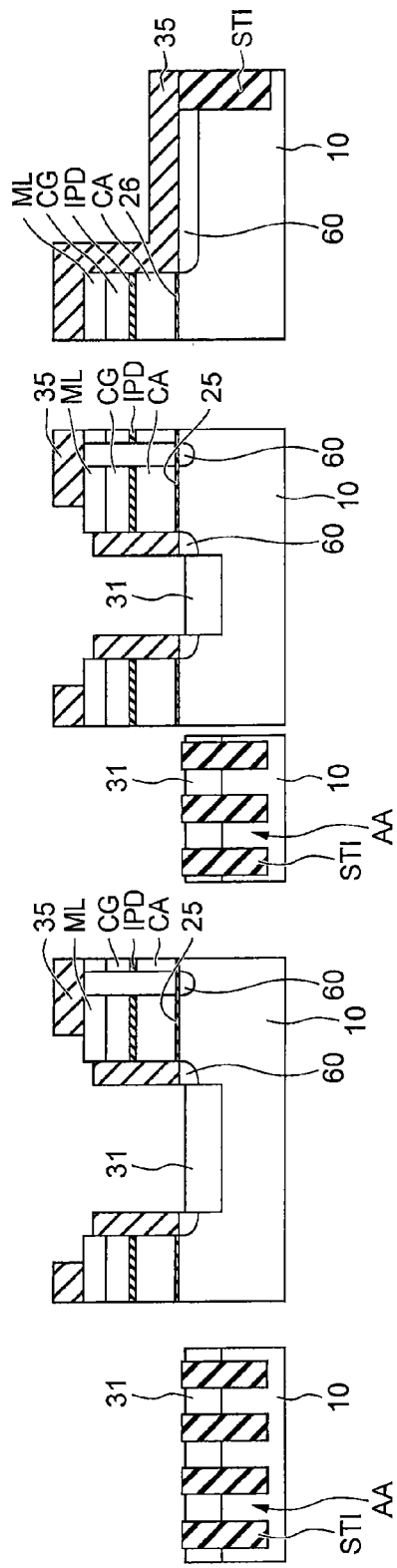

FIG. 3 is one example of a planar layout diagram of the source contacts CS and peripheral regions thereto. As in FIG. 2, the active areas AA and the shallow trench isolations STI are provided on the surface of the semiconductor substrate 10.

Each of the select gate transistors SGS is provided at each of intersections of the active areas AA and the select gate lines SGL2. As explained with reference to FIG. 1, each of the select gate transistors SGS is provided on an end of each memory cell array MCA and is provided to connect the memory cells MC (the NAND string NS) in the corresponding memory cell array MCA to source contact CS. The select gate transistor SGS is brought into conduction when the memory cells MC in the corresponding memory cell array MCA are connected to a line such as the cell source line CSL.

A region between the select gate transistors SGS respectively corresponding to two memory cell arrays MCA adjacent to each other is used as a source contact region RCS. The source contacts CS connecting to the active areas AA are provided in the source contact region RCS. Each of the source contacts CS is embedded in a trench formed to extend in the row direction over plural ones of the active areas AA and plural ones of the shallow trench isolations STI. That is, the source contact CS is provided in common for the active areas AA and the bit lines BL of plural columns and functions also as the cell source line CSL. Because the source contact CS is shared by plural ones of the active areas AA adjacent in the row direction, no problem occurs even when the width of the active areas AA is narrow.

FIGS. 4A to 4E are one example of a cross-sectional view along the line A-A in FIG. 2, a cross-sectional view along the line B-B in FIG. 2, a cross-sectional view along the line C-C in FIG. 3, a cross-sectional view along the line D-D in FIG. 3, and a cross-sectional view of a transistor part of a peripheral circuit, respectively. That is, FIGS. 4A and 4B show the bit contact region RCB and a peripheral portion thereto and FIGS. 4C and 4D show the source contact region RCS and a peripheral portion thereto. FIG. 4E is a cross-sectional view showing a partial configuration of a transistor of a peripheral circuit.

As shown in FIG. 4A, in the semiconductor substrate 10, the shallow trench isolations STI are provided, which define the active areas AA. The semiconductor substrate 10 is, for example, a silicon substrate. The shallow trench isolations STI are formed using, for example, a silicon oxide film. The bit contacts CB are formed on the active areas AA, respectively. The bit contacts CB are formed using, for example, a low-resistance metal such as tungsten. The bit contacts CB are embedded as contact plugs in an interlayer dielectric film ILD. The bit contacts CB are connected to an embedded impurity layer 30 embedded in the active areas AA, respectively. The embedded impurity layer 30 is provided in the active areas AA between the select gate transistors SGD corresponding to the adjacent memory cell arrays MCA. The embedded impurity layer 30 is formed, for example, by embedding doped polysilicon containing phosphorus or arsenic as impurities in the semiconductor substrate 10.

A low-concentration diffusion layer 20 having a lower impurity concentration than the embedded impurity layer 30 is provided around the embedded impurity layer 30. The low-concentration diffusion layer 20 is formed, for example, by ion-implanting phosphorus or arsenic into the semiconductor substrate 10. The low-concentration diffusion layer 20 and the embedded impurity layer 30 form a DDD (Double Diffused Drain) structure.

A protection film 40 and a liner layer 50 are formed on the shallow trench isolations STI. The protection film 40 is formed using, for example, an insulating film such as a silicon oxide film. The liner layer 50 is formed using, for example, an insulating film such as a silicon nitride film.

The bit contacts CB are arranged in a zigzag (or staggered) manner as mentioned above. Therefore, in the cross-sectional view of FIG. 4A, the bit contacts CB alternately appear on the active areas AA. For convenience sake, FIG. 4A virtually shows the bit contacts CB on adjacent active areas AA.

As shown in FIG. 4B, the low-concentration diffusion layer 20 and the embedded impurity layer 30 are provided in the bit contact regions RCB. The bit contacts CB are connected to the embedded impurity layer 30. Each of the bit contacts CB connects the corresponding part of the embedded impurity layer 30 and a line (a bit line BL) (not shown in FIGS. 4) formed on the bit contact CB.

The bit contact region RCB is provided between adjacent ones of the select gate transistors SGD. Each of the select gate transistors SGD includes a tunnel gate dielectric film 25 provided on the semiconductor substrate 10, a charge accumulation layer CA provided on the tunnel gate dielectric film 25, an inter-gate dielectric film IPD provided on the charge accumulation layer CA, and a control gate CG provided on the inter-gate dielectric film IPD.

The tunnel gate dielectric film 25 is formed using, for example, an insulating film such as a silicon oxide film. The charge accumulation layer CA is formed using polysilicon, a laminated film of polysilicon and a silicon nitride film, or the like. The inter-gate dielectric film IPD is formed using, for example, a silicon oxide film, a silicon nitride film, or a material having a higher permittivity than the silicon oxide film. The control gate CG is formed using, for example, polysilicon. A metal layer ML is formed using, for example, a low-resistance metal such as tungsten.

In each of the select gate transistors SGD, a part of the inter-gate dielectric film IPD is removed and the control gate CG is electrically connected to the charge accumulation layer CA. Accordingly, the control gate CG and the charge accumulation layer CA function as one gate electrode. The control gate CG and the metal layer ML extend in the row direction and function also as the select gate line SGL1.

Side surfaces in the extension direction of the active areas AA of the metal layer ML, the charge accumulation layer CA, the inter-gate dielectric film IPD, and the control gate CG and the upper surface of the metal layer ML are covered with an insulating film 35. The insulating film 35 is, for example, a silicon oxide film formed using a plasma CVD (Chemical Vapor Deposition) method. The material formed by the plasma CVD method generally has a low embeddability (coverage) and cannot enter a small gap. Therefore, an air gap AG can be provided between the gate electrode (ML, CA, and CG) of each of the select gate transistors SGD and the gate electrode of the corresponding memory cell MC. The air gap AG can reduce a parasitic capacitance between the gate electrode (ML, CA, and CG) of the select gate transistor SGD and the gate electrode of the memory cell MC.

The protection film 40 and the liner layer 50 are provided on the insulating film 35. The interlayer dielectric film ILD is further formed on the liner layer 50.

The bit contacts CB pass through the interlayer dielectric film ILD and are connected to the embedded impurity layer 30. FIG. 4B also virtually shows the bit contacts CB on adjacent active areas AA.

FIG. 4C shows the source contact CS provided on the active areas AA and the shallow trench isolations STI. The source contact CS is formed using, for example, a low-resistance metal such as tungsten. The source contact CS is provided in common for plural ones of the active areas AA adjacent in the row direction. The low-concentration diffusion layer 20 and the embedded impurity layer 30 are provided also in the source contact regions RCS. Each of the source contacts CS is connected in common to plural parts of the embedded impurity layers 30 formed in plural ones of the active areas AA adjacent in the row direction.

As shown in FIG. 4D, the low-concentration diffusion layer 20 and the embedded impurity layer 30 are provided in the source contact region RCS. The source contact CS is connected to the embedded impurity layer 30.

The source contact regions RCS is provided between adjacent ones of the select gate transistors SGS. The select gate transistors SGS have the same configuration as that of the select gate transistors SGD and thus detailed explanations thereof will be omitted.

In each of the select gate transistors SGS, a part of the inter-gate dielectric film IPD is removed and the control gate CG is electrically connected to the charge accumulation layer CA. Accordingly, the control gate CG and the charge accumulation layer CA function as one gate electrode. The control gate CG and the metal layer ML extend in the row direction and function also as the select gate line SGL2.

A transistor Tr shown in FIG. 4E has substantially the same configuration as that of the select gate transistors SGD and SGS. However, a gate dielectric film 26 can be thicker than the tunnel gate dielectric film 25 in at least a part of each peripheral circuit.

A source or drain of the transistor Tr is formed by ion implantation. Therefore, to be distinguished from the low-concentration diffusion layer 20 and the embedded impurity layer 30, the source or drain of the transistor Tr is shown as diffusion layers 70 and 80. The diffusion layers 70 and 80 form a DDD structure and function as parts of the source and drain of the transistor Tr. A contact plug CNTg is connected to the metal layer ML of a corresponding gate electrode. A contact plug CNTd is connected to the diffusion layer 70.

In the NAND flash EEPROM according to the first embodiment, the embedded impurity layer 30 is not formed by ion implantation but is formed to be embedded into the semiconductor substrate 10.

If an impurity diffusion layer is formed below the bit contacts CB by ion implantation and annealing, crystal defects occur in the active areas AA as mentioned above. Occurrence of the crystal defects leads to an increase in the contact resistance of the bit contacts CB. Furthermore, the linear pattern of the active areas AA may collapse. In such a case, the width in the row direction of the active areas AA is increased and there is a risk of the impurity diffusion layer formed by ion implantation short-circuiting to other active areas AA adjacent thereto.

On the other hand, the embedded impurity layer 30 is formed to be embedded into the semiconductor substrate 10, so that there are fewer crystal defects and an increase in the width in the row direction of the active areas AA can be suppressed. Therefore, according to the first embodiment, an increase in the contact resistance of the bit contacts CB can be suppressed and the risk of a short circuit of active areas AA adjacent to each other can be reduced. This enhances reliability of the NAND flash EEPROM.

FIGS. 5A to 15E are one example of cross-sectional views showing a method of manufacturing the NAND flash EEPROM according to the first embodiment. FIGS. A to E in FIGS. 5 to 15 correspond to FIGS. 4A to 4E, respectively. That is, FIGS. "A" and "B" in FIGS. 5 to 15 show the bit contact region RCB and a peripheral part thereto, respectively. FIGS. "C" and "D" in FIGS. 5 to 15 show the source contact region RCS and a peripheral part thereto, respectively. FIGS. "E" in FIGS. 5 to 15 show a partial configuration of a transistor of a peripheral circuit, respectively.

As shown in FIGS. 5A to 5E, the tunnel gate dielectric film 25 is first formed on the semiconductor substrate 10. For example, a silicon oxide film formed by heating the semiconductor substrate 10 in a water-vapor atmosphere is used as the tunnel gate dielectric film 25. The gate dielectric film 26 thicker than the tunnel gate dielectric film 25 can be formed in at least parts of peripheral circuit regions.

The material of the charge accumulation layer CA is then deposited on the tunnel gate dielectric film 25. For example, a polysilicon film containing phosphorus or arsenic formed using a LP (Low Pressure)-CVD method is used for the material of the charge accumulation layer CA.

A mask material (not shown) is then deposited on the material of the charge accumulation layer CA by the LP-CVD method.

The mask material is then processed in a layout pattern of the active areas AA using a lithographic technique and a RIE (Reactive Ion Etching) method.

The material of the charge accumulation layer CA and the tunnel gate dielectric film 25 are then processed by the RIE method using the processed mask material as a mask and further trenches are formed in a surface region of the semiconductor substrate 10.

Silica coating is then performed by a SOG (Spin On Glass) method and then the semiconductor substrate 10 is heated in a hydrogen atmosphere. In this way, a silicon oxide film used as the shallow trench isolations STI is filled in the trenches.

The silicon oxide film is then planarized using a CMP (Chemical Mechanical Polish) method and further the silicon oxide film is etched using the RIE method. An upper surface of the silicon oxide film (STI) is thus located at a desired position. The mask material is then removed using a hot phosphoric acid solution.

In this way, the shallow trench isolations STI, the active areas AA, the tunnel gate dielectric film 25, and the charge accumulation layer CA are formed as shown in FIGS. 5A to 5E.

The inter-gate dielectric film IPD is then formed on the upper and side surfaces of the charge accumulation layer CA as shown in FIGS. 6A to 6E. For example, an ONO film formed using the LP-CVD method is used as the inter-gate dielectric film IPD. The ONO film is, for example, a laminated film containing a silicon oxide film, a silicon nitride film, and a silicon oxide film.

The inter-gate dielectric film IPD is then processed using the lithographic technique and the RIE method. In this way, parts of the inter-gate dielectric film IPD of the select gate transistors SGD and SGS and the transistors Tr of the peripheral circuits are removed as shown in FIGS. 6B, 6D, and 6E.

The material of the control gate CG and the material of the metal layer ML are then deposited on the inter-gate dielectric film IPD. For example, a polysilicon film containing phosphorus or arsenic is used as the material of the control gate CG. A low-resistance metal such as tungsten is used for the metal layer ML, for example. In this way, the structure shown in FIGS. 6A to 6E is obtained.

A mask material (not shown) is then deposited on the metal layer ML. The mask material is processed in a layout pattern of the gate electrodes of the memory cells MC, the select gate transistors SGD and SGS, and the transistors Tr of the peripheral circuits using the lithographic technique and the RIE method and/or using a side-wall transfer process. Materials of the metal layer ML, the control gate CG, the inter-gate dielectric film IPD, and the charge accumulation layer CA are then processed by the RIE method using the mask material as a mask. In this way, the gate electrodes (ML, CG, and CA) of the memory cells MC are formed as shown in FIGS. 7B and 7D, the gate electrodes (ML, CG, and CA) of the select gate transistors SGD and SGS are formed as shown in FIGS. 7A to 7D, and the gate electrodes (ML, CG, and CA) of the transistors Tr of the peripheral circuits are formed as shown in FIG. 7E. In this case, because a part of the inter-gate dielectric film IPD is removed in each of the select gate transistors SGD and SGS and the transistors Tr of the peripheral circuits, the charge accumulation layer CA and the control gate CG are electrically connected and function as one gate electrode.

Impurities are then ion-implanted using the gate electrodes of the memory cells MC and the transistors Tr of the peripheral circuits as a mask. The impurities to be implanted are phosphorus or arsine, for example. In this way, the diffusion layer 60 that series-connects plural ones of the memory cells MC is formed.

The silicon oxide film 35 is then deposited on the side surfaces of the metal layer ML, the control gate CG, the inter-gate dielectric film IPD, and the charge accumulation layer CA and the upper surface of the metal layer ML using the plasma CVD method. At that time, the silicon oxide film 35 is formed by depositing mono-silane according to the plasma CVD method. The material deposited according to the plasma CVD method has a low embeddability (coverage) and thus is not embedded between the memory cells MC adjacent in the column direction or between the memory cell MC and the select gate transistor SGD or SGS. On the other hand, the material deposited according to the plasma CVD can be embedded in the bit contact region RCB between adjacent ones of the select gate transistors SGD and the source contact region RCS between adjacent ones of the select gate transistors SGS. Therefore, the air gap AG is formed between the gate electrode of the select gate transistor SGD or SGS and the gate electrode of the memory cell MC as shown in FIGS. 8A to 8E. The silicon oxide film 35 is deposited to cover the side surfaces of the metal layer ML, the control gate CG, the inter-gate dielectric film IPD, and the charge accumulation layer CA and the upper surface of the metal layer ML.

The upper surface of the metal layer ML and the peripheral circuit regions are then covered with a photoresist PR using the lithographic technique. The silicon oxide film 35, the tunnel gate dielectric film 25, and the semiconductor substrate 10 are then processed using the photoresist PR, the gate electrodes (ML, CG, and CA), and the silicon oxide film 35 as a mask. In this way, trenches TR are formed in the bit contact regions RCB and the source contact regions RCS as shown in FIGS. 9A to 9E. The trenches TR are formed by etching the semiconductor substrate 10. Accordingly, formation of the trenches TR removes a part of the diffusion layer 60 in the bit contact regions RCB and the source contact regions RCS.

The silicon oxide film 35 on the side surfaces of the metal layer ML, the control gate CG, the inter-gate dielectric film IPD, and the charge accumulation layer CA remains as a side wall film. The silicon oxide film 35 on the metal layer ML also remains. The peripheral circuit regions remain covered with the silicon oxide film 35.

Phosphorus or arsine is then ion-implanted into the semiconductor substrate 10 on the inner surface of each of the trenches TR using the photoresist PR, the silicon oxide film 35 (the side wall film), and the gate electrodes as a mask. In this way, the low-concentration diffusion layer 20 is formed on the inner surface of each of the trenches TR in the bit contact regions RCB and the source contact regions RCS as shown in FIGS. 10A to 10E. At that time, ion implantation is performed at a low concentration of impurities and at a relatively-low acceleration energy. Accordingly, relatively few crystal defects and deformations occur in the semiconductor substrate 10.

The material of the embedded impurity layer 30 is then embedded into the trenches TR as shown in FIGS. 11A to 11E. For example, polysilicon containing phosphorus or arsine is used for the embedded impurity layer 30. The embedded impurity layer 30 has a higher impurity concentration than the low-concentration diffusion layer 20. The embedded impurity layer 30 is then etched back using a CDE (Chemical Dry Etching) method until the shallow trench isolations STI are exposed. In this way, the embedded impurity layer 30 is formed as shown in FIGS. 12A to 12E. The embedded impurity layer 30 is formed not by ion implantation into the semiconductor substrate 10 but by embedding. The embedded impurity layer 30 formed by embedding has fewer crystal defects than a high-concentration diffusion layer formed by ion implantation. Because the shape of the embedded impurity layer 30 depends on the trenches TR, it is stable and not easily deformed.

The memory cell arrays MCA are then covered with a photoresist PR and the silicon oxide film 35 in the peripheral circuit regions is exposed using the lithographic technique. The silicon oxide film 35 in the peripheral circuit regions is etched back using the RIE method to leave the silicon oxide film 35 on the side surfaces of the gate electrodes of the transistors Tr of the peripheral circuits. In this way, the structure shown in FIGS. 13A to 13E is obtained.

After the photoresist PR is removed, the protection film 40 and the liner layer 50 are deposited. The protection film 40 is formed using, for example, an insulating film such as a silicon oxide film. The liner layer 50 is formed using, for example, an insulating film such as a silicon nitride film.

Regions other than source and drain regions of the transistors Tr of the peripheral circuits are then covered with a photoresist (not shown) using the lithographic technique. Impurities are then ion-implanted into the source and drain regions of the transistors Tr and thermally treated. In this way, the diffusion layer 70 having a relatively-low impurity concentration and the diffusion layer 80 having a higher impurity concentration than the diffusion layer 70 are formed as the source and drain of each transistor Tr as shown in FIGS. 14A to 14E. The diffusion layers 70 and 80 form a DDD structure.

The material of the interlayer dielectric film ILD is then deposited as shown in FIGS. 15A to 15E. Contact holes CH are formed in the interlayer dielectric film ILD in bit contact regions RCB and contact trenches CTR are formed in the interlayer dielectric film ILD in the source contact regions RCS using the lithographic technique. The contact trenches CTR are formed as trenches extending in the row direction.

The material of the contact plugs (CB, CS, CNTg, and CNTd) is then embedded in the contact holes CH and the contact trenches CTR. For example, a low-resistance metal such as tungsten is used as the material of the contact plugs (CB, CS, CNTg, and CNTd). The material of the contact plugs is then polished using the CMP method. In this way, the bit contacts CB, the source contacts CS, and the contact plugs CNTg and CNTd are formed as shown in FIGS. 4A to 4E. The bit lines BL are then formed on the bit contacts CB. A multilayer interconnection structure is further formed on the bit lines BL and the source contacts CS, thereby completing the NAND flash EEPROM according to the first embodiment.

In the NAND flash EEPROM according to the first embodiment, the embedded impurity layer 30 is formed by being embedded into the trenches TR formed in the semiconductor substrate 10. Accordingly, the embedded impurity layer 30 has fewer crystal defects and can suppress an increase in the width in the row direction without deformation. Therefore, an increase in the contact resistance of the bit contacts CB can be suppressed and the risk of a short circuit of the active areas AA adjacent to each other can be reduced.

(Second Embodiment)

A NAND flash EEPROM according to a second embodiment is different from that according to the first embodiment in that the embedded impurity layer 30 is monocrystalline silicon. The embedded impurity layer 30 is formed by epitaxially growing silicon while impurities are introduced. Other configurations of the second embodiment can be identical to the corresponding ones of the first embodiment. Configurations of the second embodiment are basically identical to those in FIGS. 1 to 4. The second embodiment is different from the first embodiment in the material and the formation method of the embedded impurity layer 30. The embedded impurity layer according to the second embodiment is denoted by reference numeral 31 below for convenience sake.

FIGS. 16A to 18E are one example of cross-sectional views showing a method of manufacturing the NAND flash EEPROM according to the second embodiment. FIGS. "A" to "E" in FIGS. 16 to 18 correspond to FIGS. 4A to 4E, respectively.

Steps mentioned above with reference to FIGS. 5A to 9E are first performed. After the photoresist PR is then removed, a silicon monocrystal is epitaxially grown from the inner surfaces of the trenches TR through which the semiconductor substrate 10 is exposed as shown in FIGS. 16A to 16E. At that time, the silicon monocrystal is grown while phosphorus or arsine is introduced, for example. In this way, the embedded impurity layer 31 using the silicon monocrystal is formed. The embedded impurity layer 31 has a higher impurity concentration than the low-concentration diffusion layer 20.

The embedded impurity layer 31 is then etched back using the CDE method until the shallow trench isolations STI are exposed. In this way, the structure shown in FIGS. 17A to 17E is obtained. The embedded impurity layer 31 is formed not by ion implantation into the semiconductor substrate 10 but is formed to be embedded (epitaxially grown) therein. The embedded impurity layer 31 formed by embedding has fewer crystal defects than a high-concentration diffusion layer formed by ion implantation. Because the embedded impurity layer 31 according to the second embodiment is a silicon monocrystal, there are much fewer crystal defects. Furthermore, because the shape of the embedded impurity layer 31 depends on the trenches TR, it is stable and not easily deformed.

The protection film 40 and the liner layer 50 are then deposited thereon as shown in FIGS. 18A to 18E. Phosphorus or arsine is then ion-implanted into the semiconductor substrate 10 using the silicon oxide film (the side wall film) 35 and the gate electrodes (ML, CG, and CA) as a mask and is thermally treated using a RTA (Rapid Thermal Anneal) method. In this way, the low-concentration diffusion layer 20 is formed on the semiconductor substrate 10 around the embedded impurity layer 31 in the bit contact regions RCB and the source contact regions RCS. The low-concentration diffusion layer 20 and the embedded impurity layer 31 form a DDD structure. Ion implantation at that time is executed at a low concentration of impurities and at a relatively-low acceleration energy. Accordingly, the semiconductor substrate 10 has relatively few crystal defects and deformations.

The contact holes CH, the contact trenches CT, and the contact plugs CB, CS, CNTg, and CNTd are then formed in the manner as explained with reference to FIGS. 15A to 15E. The bit lines BL and the multilayer interconnection structure are further formed, thereby completing the NAND flash EEPROM according to the second embodiment.

According to the second embodiment, because the embedded impurity layer 31 is monocrystalline silicon, much fewer crystal defects occur. Furthermore, the embedded impurity layer 31 according to the second embodiment is embedded into the trenches TR as that in the first embodiment and thus is not easily deformed. Accordingly, the second embodiment can achieve effects identical to those of the first embodiment.

In the embodiments mentioned above, the embedded impurity layers 30 and 31 are provided in both of the bit contact regions RCB and the source contact regions RCS. However, the embedded impurity layers 30 and 31 can be formed only in the bit contact regions RCB. Because the source contacts CS are shared by plural ones of the active areas AA, few problems occur even when the active areas AA are deformed by ion implantation. In this case, it suffices to form a DDD structure by ion-implanting impurities into the source contact regions RCS in the same manner as the source and drain of each transistor Tr in the peripheral circuit regions. As described above, the effects of the embodiments mentioned above are not lost even when the embedded impurity layers 30 and 31 are formed only in the bit contact regions RCB.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor storage device comprising:
   a semiconductor substrate;
   memory cell arrays each including a plurality of memory cells on the semiconductor substrate;
   select gate transistors being provided on ends of the memory cell arrays and being brought into conduction when the memory cells are connected to a corresponding line;
   an embedded impurity layer being embedded in active areas between the select gate transistors respectively corresponding to the memory cell arrays adjacent to each other,
   contact plugs connecting between the embedded impurity layer and the corresponding lines, and
   a diffusion layer being located around the embedded impurity layer or beneath thereof and having an impurity concentration lower than that of the embedded impurity layer.

2. The device of claim 1, wherein the embedded impurity layer is a polysilicon layer having impurities introduced therein.

3. The device of claim 1, wherein the embedded impurity layer is a monocrystalline silicon layer having impurities introduced therein.

4. The device of claim 1, wherein the embedded impurity layer is an epitaxial silicon layer having impurities introduced therein.

5. The device of claim 1, wherein the embedded impurity layer contains phosphorus or arsenic as impurities.

6. The device of claim 1, wherein
   a gate electrode of each of the select gate transistors has
   a charge accumulation layer above the semiconductor substrate,
   an inter-gate dielectric film on the charge accumulation layer,
   a control gate on the inter-gate dielectric film, and
   a metal film on the control gate.

7. A manufacturing method of a semiconductor storage device comprising:
   forming gate electrodes of a plurality of memory cells and gate electrodes of select gate transistors being located on ends of memory cell arrays each including the memory cells above a semiconductor substrate;
   forming trenches in portions of the semiconductor substrate between the select gate transistors respectively corresponding to a plurality of the memory cell arrays adjacent to each other using the gate electrodes as a mask;
   forming an embedded impurity layer by embedding a semiconductor material having impurities introduced therein into the trenches; and
   forming contact plugs connected to the embedded impurity layer.

8. The method of claim 7, further comprising forming a diffusion layer having an impurity concentration lower than that of the embedded impurity layer on inner surfaces of the trenches by introducing impurities into the inner surfaces of the trenches using the gate electrodes as a mask, after formation of the trenches.

9. The method of claim 7, wherein the embedded impurity layer is formed by depositing a polysilicon layer having impurities introduced therein.

10. The method of claim 8, wherein the embedded impurity layer is formed by depositing a polysilicon layer having impurities introduced therein.

11. The method of claim 7, wherein the embedded impurity layer is formed by epitaxially growing a monocrystalline silicon layer having impurities introduced therein.

12. The method of claim 8, wherein the embedded impurity layer is formed by epitaxially growing a monocrystalline silicon layer having impurities introduced therein.

13. The method of claim 7, wherein the impurities contained in the embedded impurity layer are phosphorus or arsenic.

14. The method of claim 7, wherein the gate electrodes are formed by depositing materials of a charge accumulation layer, an inter-gate dielectric film, a control gate, and a metal film above the semiconductor substrate and processing the charge accumulation layer, the inter-gate dielectric film, the control gate, and the metal film.

* * * * *